(12) United States Patent
Canter et al.

(10) Patent No.: US 6,760,220 B2
(45) Date of Patent: Jul. 6, 2004

(54) RUGGED MODULAR PC 104 CHASSIS WITH BLIND MATE CONNECTOR AND FORCED CONVECTION COOLING CAPABILITIES

(75) Inventors: Donald C. Canter, Bel Air, MD (US); Michael A. Watts, Bel Air, MD (US)

(73) Assignee: Lockheed Martin Corporation, Bethesda, MD (US)

( * ) Notice: Subject to any disclaimer, the term of this patent is extended or adjusted under 35 U.S.C. 154(b) by 26 days.

(21) Appl. No.: 10/303,004

(22) Filed: Nov. 25, 2002

(65) Prior Publication Data

US 2004/0100767 A1 May 27, 2004

(51) Int. Cl.[7] .............................................. H05K 7/20
(52) U.S. Cl. .................. 361/694; 361/736; 361/728; 361/740; 361/796; 361/797; 361/801; 361/802; 361/660; 361/679; 211/41.17; 454/184
(58) Field of Search .................. 211/41.17; 62/259.2; 454/184; 312/223.2; 361/600, 679, 690, 687–688, 694–685, 707, 710, 715, 719–721, 725–733, 736–748, 752–759, 796–798, 801–802, 807, 809–810

(56) References Cited

U.S. PATENT DOCUMENTS

| | | | | |
|---|---|---|---|---|
| 2,907,926 A | * | 10/1959 | Slack | 361/742 |
| RE25,317 E | * | 1/1963 | McCoy | 361/798 |
| 3,198,991 A | * | 8/1965 | Barnett | 361/694 |
| 3,328,646 A | * | 6/1967 | Marie | 361/796 |
| 3,411,014 A | * | 11/1968 | Kupferberg | 307/24 |
| 4,012,672 A | * | 3/1977 | Douglass et al. | 361/829 |
| 4,503,484 A | * | 3/1985 | Moxon | 361/736 |
| 5,173,845 A | * | 12/1992 | Shaw | 361/798 |
| 5,390,083 A | * | 2/1995 | Decker et al. | 361/796 |
| 5,808,866 A | * | 9/1998 | Porter | 361/695 |
| 6,351,381 B1 | * | 2/2002 | Bilski et al. | 361/695 |
| 6,373,712 B1 | * | 4/2002 | Bailis et al. | 361/756 |
| 6,392,891 B1 | * | 5/2002 | Tzlil et al. | 361/719 |
| 6,411,517 B1 | * | 6/2002 | Babin | 361/759 |
| 6,449,159 B1 | * | 9/2002 | Haba | 361/707 |
| 6,452,787 B1 | * | 9/2002 | Lu et al. | 361/683 |
| 6,452,797 B1 | * | 9/2002 | Konstad | 361/695 |
| 6,457,978 B1 | * | 10/2002 | Cloonan et al. | 439/61 |
| 6,529,374 B2 | * | 3/2003 | Yamashita et al. | 361/687 |

* cited by examiner

Primary Examiner—Gregory D. Thompson
(74) Attorney, Agent, or Firm—Mark A. Wurm

(57) ABSTRACT

A chassis for circuit cards has a housing, a front end, a connector end, and a top cover. The housing has an airflow slot on its underside, and the top cover is open in nature, the combination of which allows the flow of forced convection air from top to bottom (or vice versa) to cool the circuit cards. The connector end has alignment pins which assist in blind mating of the chassis in difficult to access areas. Stabilizer rods, spacers and spacer brackets, made from stainless steel, hold the circuit cards in place and protect them from shock, vibration, and other trauma. The front end has a jacking type screw which enables one to exert sufficient pressure so that the greater than 200 I/O pins at the connector end are easily forced into receiving sockets.

19 Claims, 8 Drawing Sheets

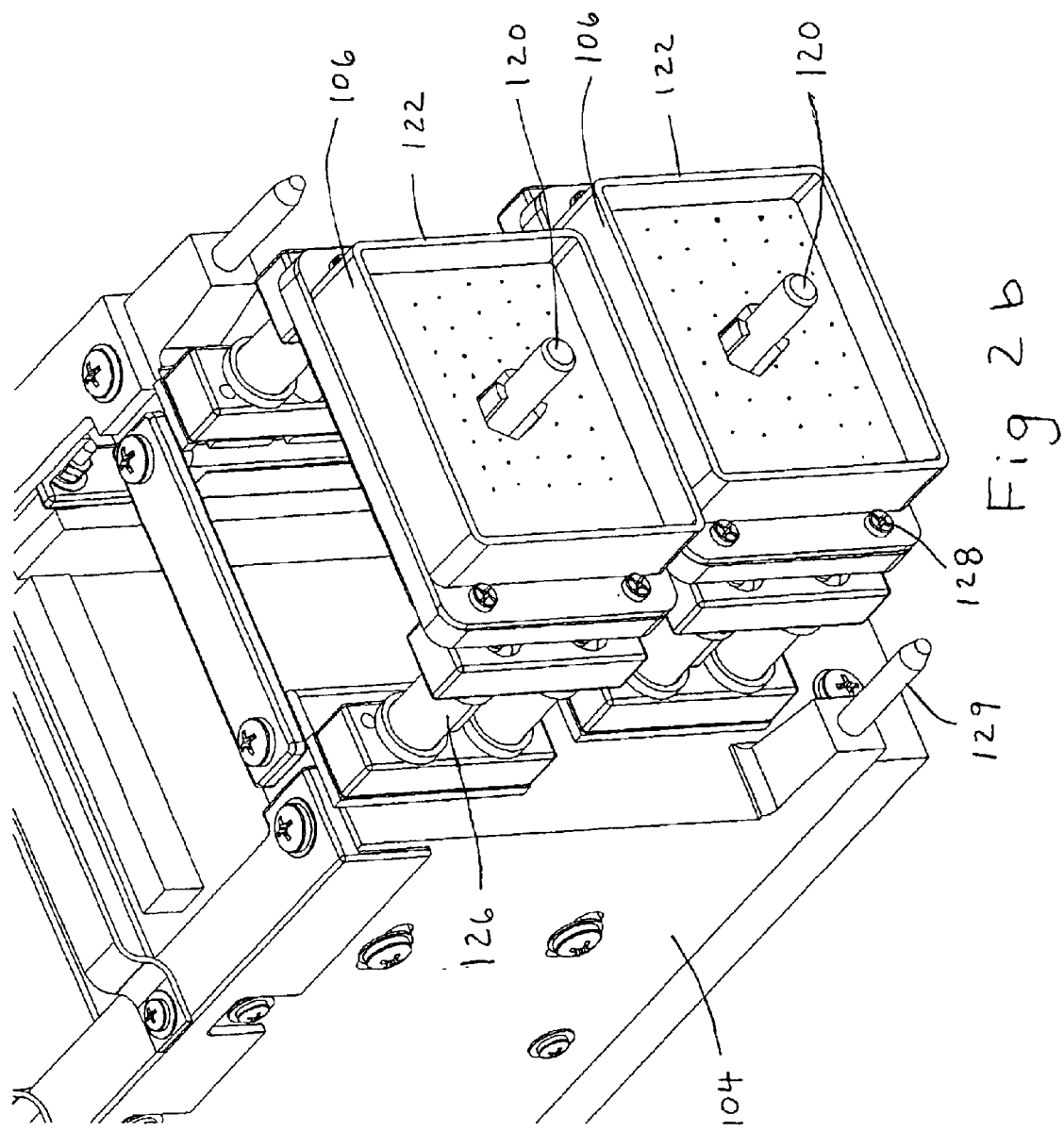

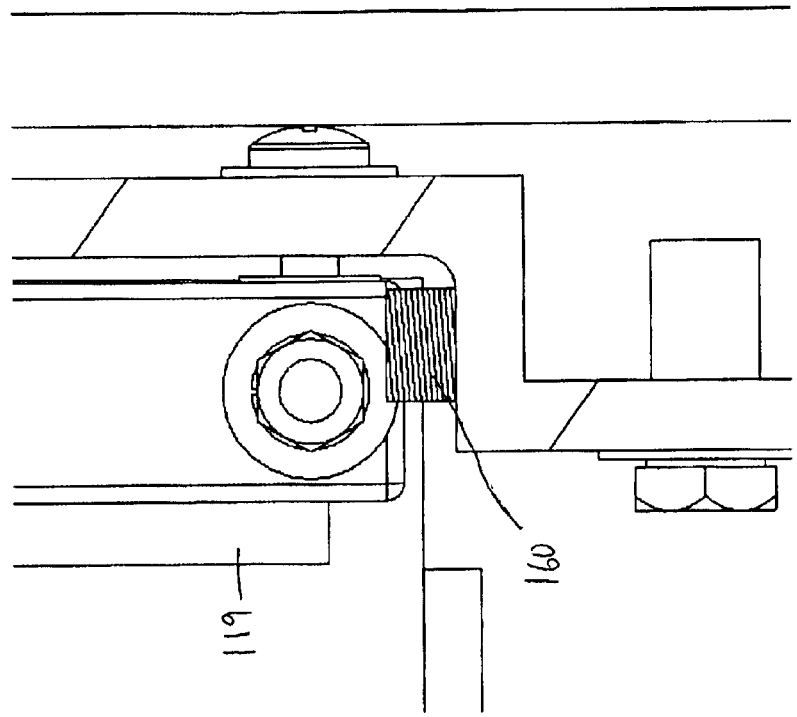
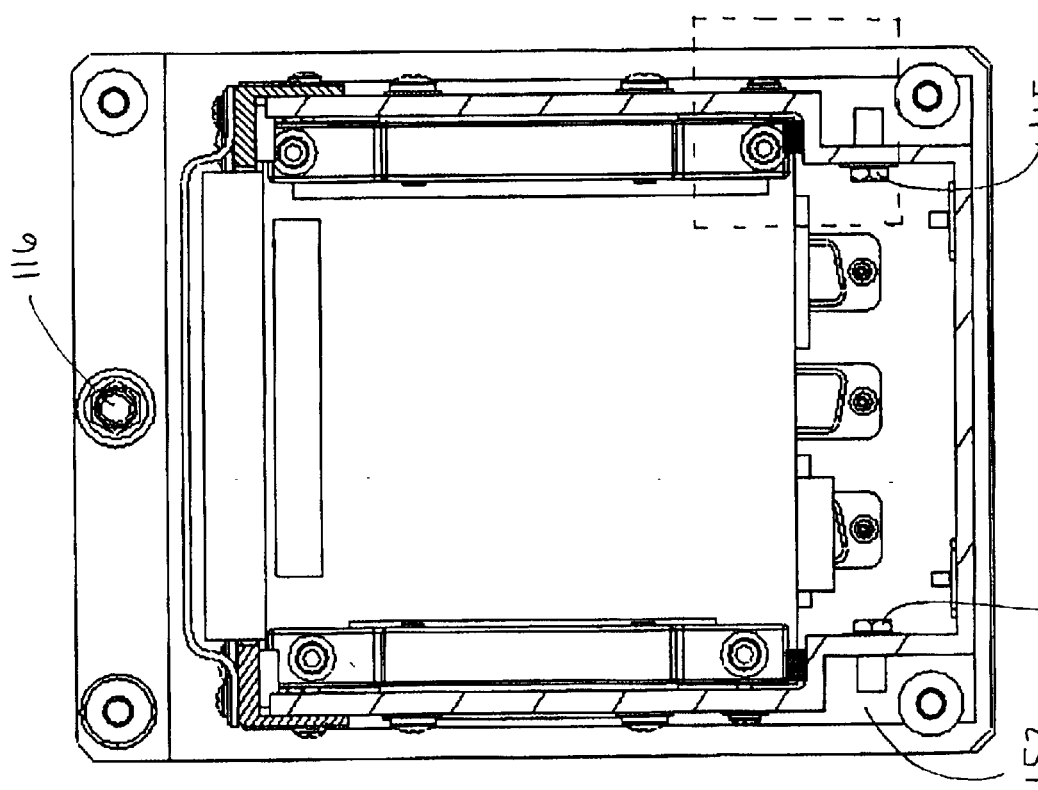

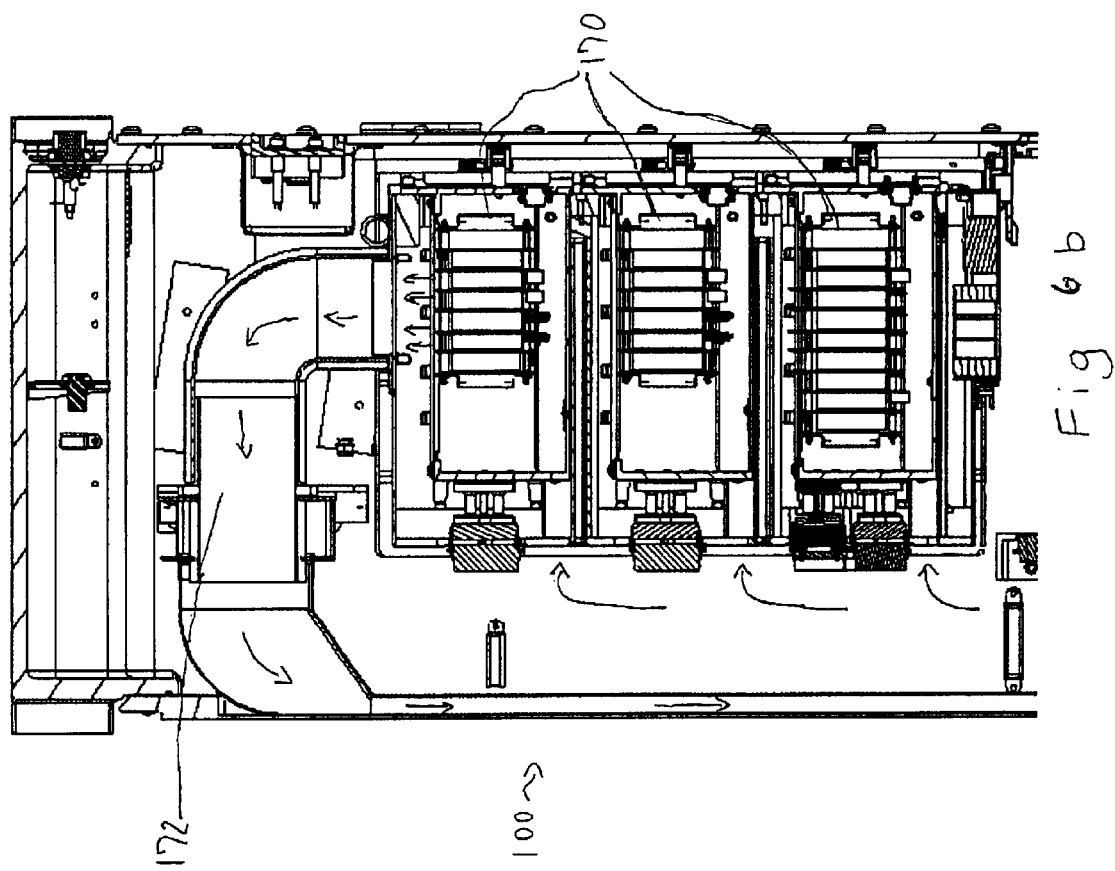
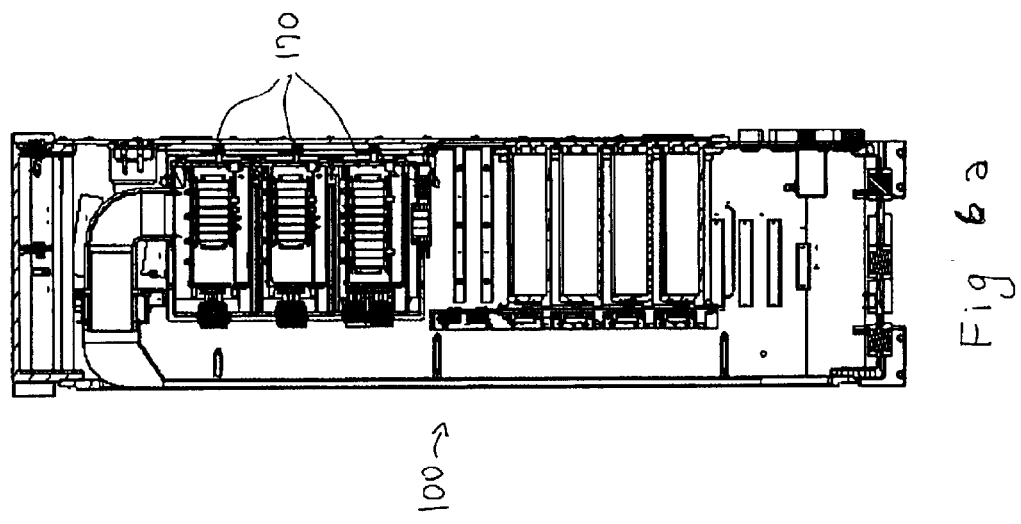

RUGGED MODULAR PC 104 CHASSIS WITH BLIND MATE CONNECTOR AND FORCED CONVECTION COOLING CAPABILITIES

FIELD OF THE INVENTION

The present invention relates to a chassis which houses multiple circuit cards, and in particular, a chassis for industry standard PC 104 circuit cards.

BACKGROUND

In many electronic applications today, circuits are burned into an integrated circuit chip, which in turn is electrically connected to other integrated circuit chips via their placement on a circuit board. The circuit board can then be installed into a system involving computer control and/or other purposes. Thereafter, if there is any problem with the operation of the circuit card within the system, the circuit card can be easily replaced with a new one.

The ubiquity of circuit cards has led to some standardization of circuit cards. One standard, the PC 104 standard, is used in a variety of environments ranging from personal computers to components of aircraft systems, naval ships and rocket launched vehicles. In some of these environments, such as the aircraft systems or rocket launchers, the circuit cards may be exposed to extreme shock, vibration, and extreme temperatures, all of which can damage the circuit cards. Because of the harsh environment that PC 104 circuit cards may be exposed to, there is a need for a system to protect these circuit cards.

SUMMARY OF THE INVENTION

The present invention is a circuit card chassis which receives, holds, and electrically connects circuit cards, and in particular, standard PC 104 circuit cards. The invention is particularly useful for PC 104 circuit cards which are used in harsh environments such as aircraft systems, naval ship and rocket launched vehicles. The chassis consists of a front face, a connector end opposite the front face, and housing walls on its side and bottom. The front face includes features such as a cable restraint handle mechanism, I/O connectors, mounting hardware and installation jacking type screws. The connector end includes alignment pins, I/O connector pins, and an I/O connector pin guard.

The chassis has a top cover consisting of two longitudinal braces and one or more transverse guards attached to the longitudinal braces. The top cover is held in place by fasteners which connect the longitudinal braces to the side walls of the housing.

The chassis holds one or more circuit cards in a stack through the use of spacers, spacer brackets and stabilizer rods. The stabilizer rods penetrate holes in the circuit cards, are attached to the chassis housing, and hold the circuit cards firmly in place. The spacers and spacer brackets maintain a cushion of dead space between the circuit cards. This dead space helps to prevent any damaging contact between circuit cards, and provides a path for forced convection air to pass over and around the circuit cards. The stabilizer rods, spacers, and spacer brackets are made out of stainless steel, which impart strength and sturdiness to the chassis and circuit card stack thereby protecting the circuit cards.

These aforementioned features of the invention, along with other features of the invention, satisfy the following objectives.

It is an object of the present invention to maintain the operation of PC 104 circuit cards in harsh environments.

It is another object of the present invention to maintain the operation of PC 104 circuit cards in environments that include shock trauma.

It is a further object of the present invention to maintain the operation of PC 104 circuit cards in environments that include shock trauma.

It is a still further object of the present invention to maintain the operation of PC 104 circuit cards in environments that include elevated temperatures.

BRIEF DESCRIPTION OF THE DRAWINGS

FIG. 2b is an enlarged view of the rear portion of the PC 104 circuit card chassis of FIG. 2a.

FIG. 3b is an enlarged view of a portion of FIG. 3a.

FIG. 5a is a sectional view of the circuit card chassis of the present invention.

FIG. 5b is an enlarged view of a portion of FIG. 5a.

FIG. 6a illustrates several circuit card chassis of the present invention installed in an industrial application.

FIG. 6b is an enlarged view of a portion of FIG. 6a illustrating a forced convection air path over the circuit cards and through the circuit card chassis of the present invention.

DETAILED DESCRIPTION

Figure 1:
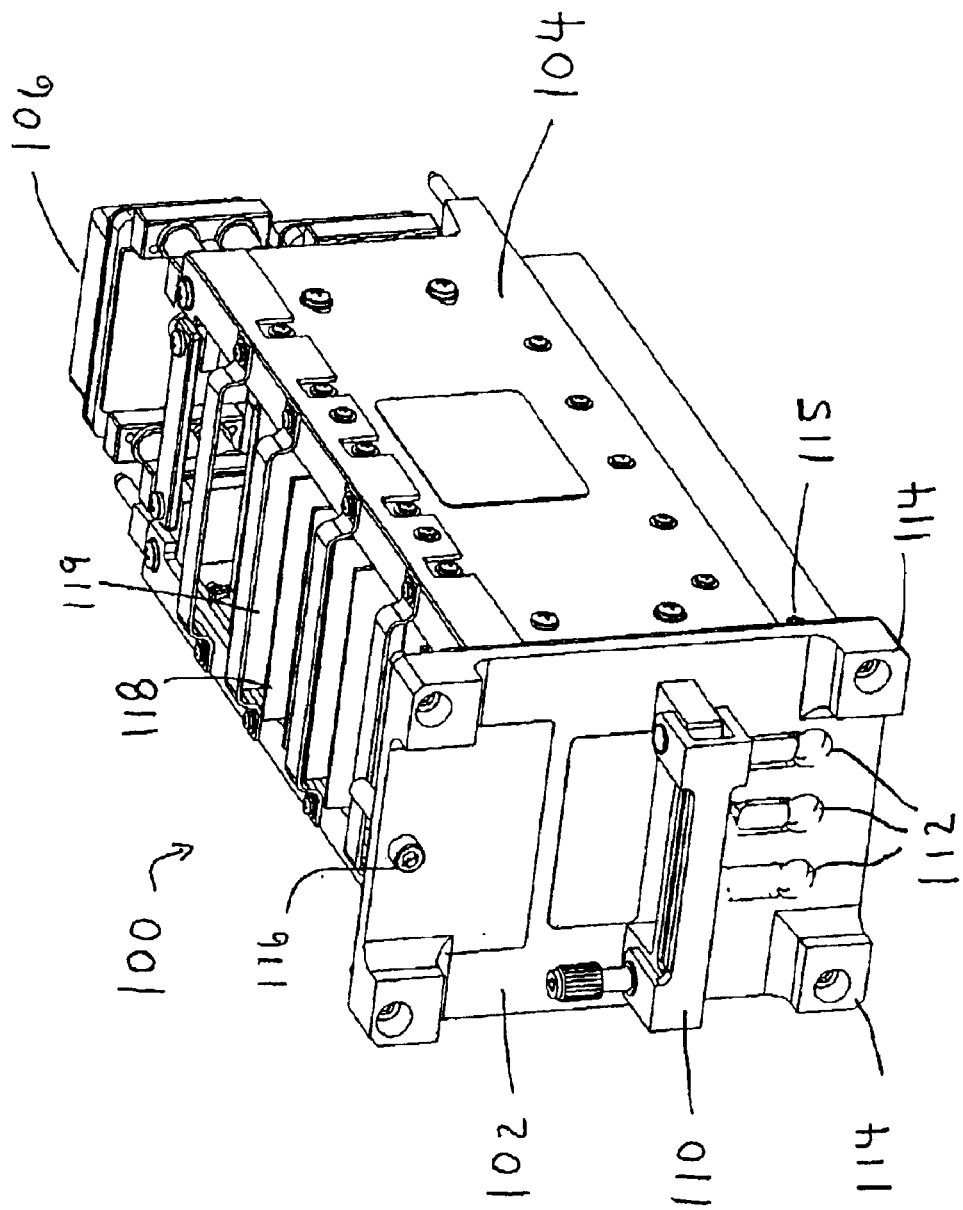
FIG. 1 is a perspective view of the PC 104 circuit card chassis of the present invention.

The PC 104 circuit card chassis 100 of the present invention is illustrated in FIG. 1.

The chassis 100 is formed by front face 102, housing 104, and connector end 106. FIG. 1 further illustrates that the front face 102 includes a cable restraint mechanism 110, I/O connectors 112, mounting hardware 114, moment pins 115, and an installation jacking type screw 116. In a preferred embodiment, the chassis 100 is able to hold up to 10 PC 104 type circuit cards 118 in a circuit card stack 119.

Figure 2A:
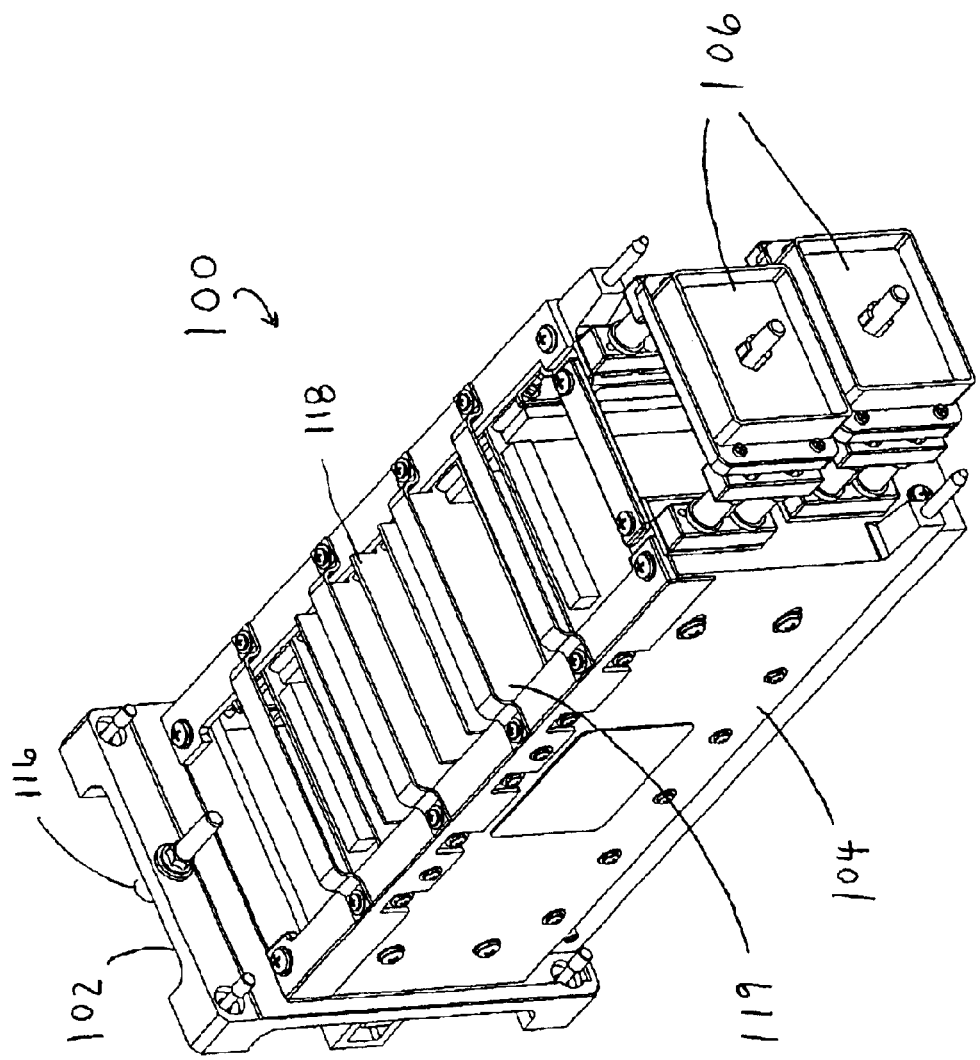
FIG. 2a is a rear perspective view of the PC 104 circuit card chassis of present invention.

FIG. 2a illustrates connector ends 106, and FIG. 2b is an enlarged view of the outlined portion of FIG. 2a. Each connector end 106 contains a connection alignment pin 120, pin guard 122, I/O connectors 124, and connector alignment unit 126. In a preferred embodiment, there are 212 I/O connector pins 124 on the connector end 106. Alternatively a different number, such as 316, of I/O connector pins could be used. Connector alignment unit 126 connects the connector end 106 to the housing 104. Similarly, fasteners 128 attach the I/O connectors 124 to the connector alignment kit 126 and the pin guard 122. Connector end 106 further contains shear alignment pins 129.

Figure 3A:
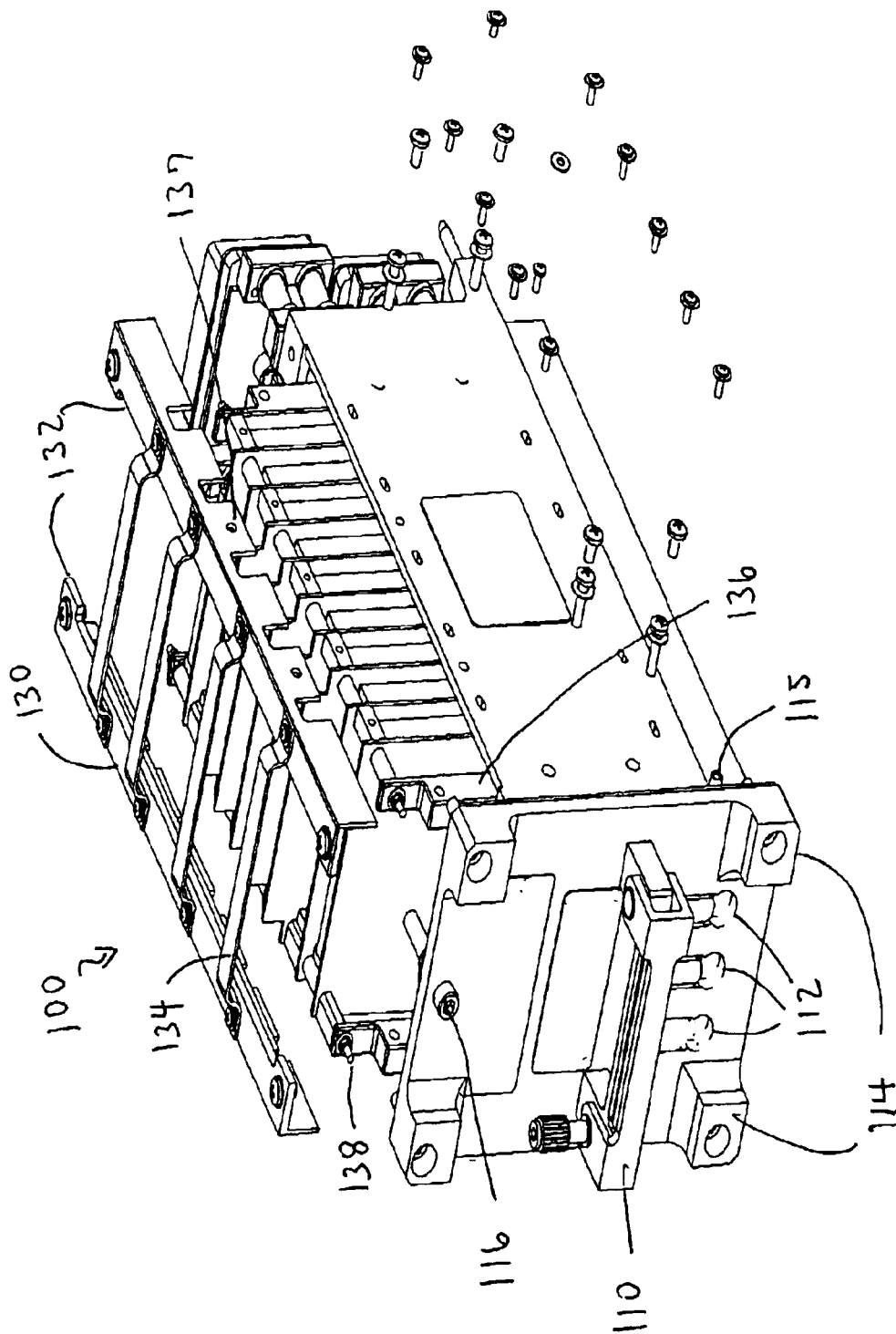
FIG. 3a is an exploded view of the PC 104 circuit card chassis of the present invention.
Figure 3B:
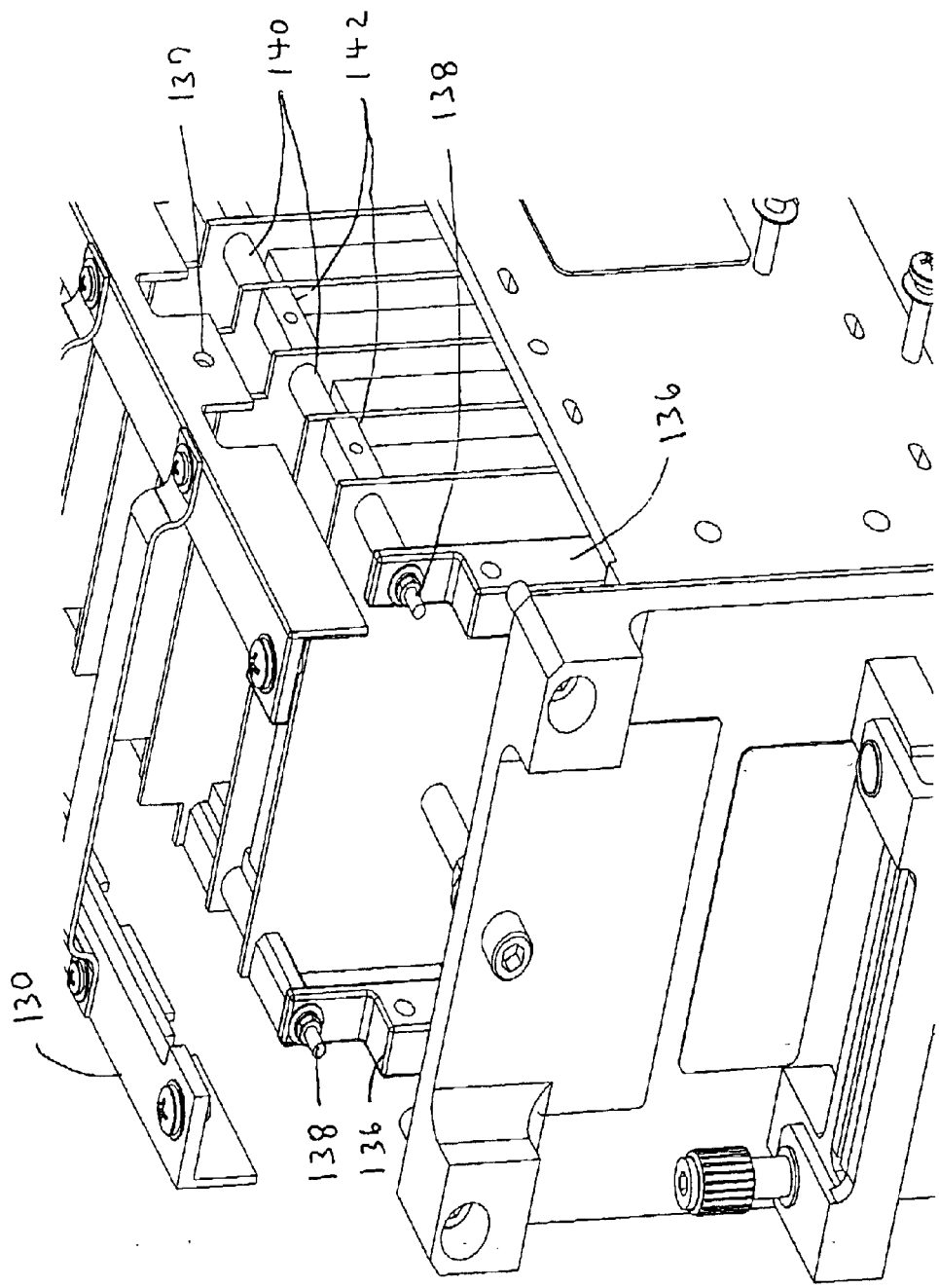

FIG. 3a is a partially exploded view of the chassis 100 which best illustrates the top cover 130. Top cover 130 consists of two longitudinal braces 132, and one or more protective guards 134 positioned transversely to the braces 132. Longitudinal braces 132 have one or more holes 137, through which fasteners are inserted to connect the top cover 130 to the housing 104. Mounting brackets 136 are mounted on either front face 102 and/or housing 104 at the front face end of the chassis 100, and to the connector end 106 and/or housing 104 at the connector end of the chassis 100. The brackets 136 have openings that receive stabilizer rods 138, thereby allowing the stabilizer rods 138 to extend over the length of the chassis 100. FIG. 3b is an enlarged view of the outlined portion of FIG. 3a and illustrates that spacers 140 and spacer brackets 142 are positioned on the stabilizer rods 138. The stabilizer rods 138, spacers 140, and spacer brackets 142 are manufactured out of stainless steel, and form the PC 104 circuit card stack 119. The stabilizer rods 138 penetrate each circuit card 118 through an opening in the circuit card 118, and spacers 140 and spacer brackets 142 are positioned on the stabilizer rods 138 to provide an area of dead space between each circuit card 118, thereby forming circuit card stack 119. It is through the stabilizer rods 138, which are attached to housing 104 via mounting brackets 136, that the circuit card stack 119 is secured to the housing 104. Rubber padding (not visible in FIGS. 3a, 3b) is placed on the underside of longitudinal braces 132 and protective guards 134.

Figure 4:
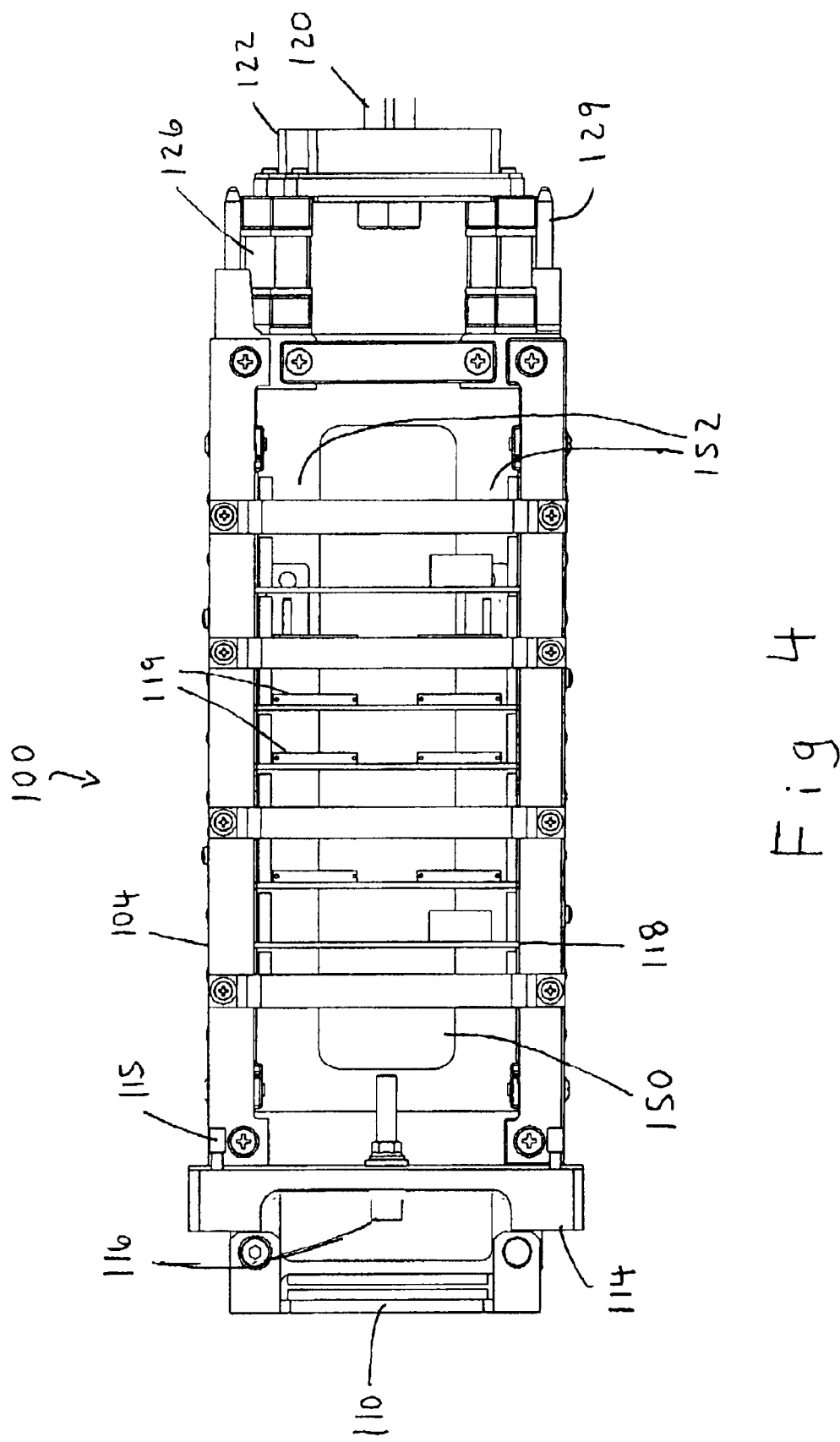
FIG. 4 is a view of the underside of the PC 104 circuit card chassis of the present invention.

The bottom of the chassis 100 is illustrated in FIG. 4. As can be seen from FIG. 4, housing 104 has air flow slot 150 on its bottom side, the purpose of which will be explained in detail shortly. Between the bottom portion of housing 104 and circuit card stack 119 is cable routing space 152 which runs the length of the chassis 100. Cable routing space 152 accommodates network and other wiring which may be routed to the chassis front face 102 or to blind connectors at the connector end 106.

Also between the bottom of housing 104 and circuit card stack 119 are segments of rubber padding 160, as best illustrated in FIG. 5b which is an enlarged view of the outlined portion of FIG. 5a. FIG. 5a is a sectional view of the chassis 100 and illustrates more clearly the cable routing space 152 and moment pins 115.

The chassis 100 may be installed into systems exposed to harsh conditions such as in an aircraft or a rocket launching system. FIG. 6a further illustrates the use of more than one circuit card stack 119 in a particular installation. FIG. 6a illustrates a set up with three rows 170 of three circuit card stacks 119. FIG. 6b is an enlarged view of FIG. 6a, showing the top rows 170 of the three circuit card stacks 119, and the manner in which air may be circulated through the circuit card stacks 119 to maintain the temperature around the circuit card stacks 119.

The structural design of chassis 100, and the material out of which it is manufactured, imbues chassis 100 with a ruggedness which protects the circuit card stack 119 in harsh environments. In particular, the design of the chassis 100 protects the circuit card stack 119 from excessive vibration, shock, and temperature. The structure and design of the chassis 100 further enables blind-mating of the I/O connector pins 124 with receiving sockets for such pins, i.e. when there is no ability to visually guide the I/O connector pins 124 into their receiving sockets such as in tight, difficult to access locations.

The shock resistance features of the chassis 100 arise mainly from the materials out of which the chassis 100 is made. Specifically, the vast majority of the chassis 100 is made of an aluminum alloy. In a preferred embodiment, the aluminum alloy is one that is good in an investment casting process—for example A357T6 class 10, Grade C aluminum alloy in accordance with SAE AM5-A 21180. The aluminum alloy imparts sufficient strength to the less critical portions of the chassis 100 without unduly adding to the weight of the chassis 100. The stabilizing rods 138, spacers 140, and spacer brackets 142 by comparison are manufactured out of stainless steel, which is more rigid, sturdier and stronger than the aluminum alloy. The added strength of the stainless steel is needed in the stabilizer rods 138, spacers 140, and spacer brackets 142 because the stabilizer rods 138 attach the circuit card stack 119 to the housing 104, and the spacers 140 and spacer brackets 142 maintain a protective space between the circuit cards 118 in the circuit card stack 119. The protective space prevents damaging contact between circuit cards 118 when the chassis 100 is exposed to shock or other trauma.

The vibration resistant features of the chassis 100 arise mainly from the stabilizer rods 138 and the rubber padding 160 placed under the top cover 130 and between the circuit card stack 119 and the base portion of the housing 104. The stabilizer rods 138 penetrate each circuit card 118 through openings in each circuit card 118. The stabilizer rods 138, which are firmly held in place via their attachment to front end 102 and connector end 106, likewise firmly hold the circuit cards 118 firmly in place, thereby preventing any vibration experienced by the chassis 100 from damaging the circuit cards 118. In addition to protecting the circuit cards 118 from shock, spacers 140 and spacer brackets 142 assist in protecting the circuit card 118 from vibration by providing a protective space between the stabilized circuit cards 118.

The circuit card stack 119 is further protected from shock and other trauma by top cover 130. The longitudinal braces 132, in conjunction with the protective guards 134, assist in stabilizing the housing 104 and the stabilizing rods 138 by means of the top cover 130's attachment to the housing 104 via fasteners through holes 137. Stability and rigidity of the housing 104 and stabilizer rods 138 add to the protective features of the chassis 100. Moreover, the protective guards 134 help prevent any direct trauma from damaging the circuit card stack 119.

The ability of the chassis 100 to protect the circuit card stack 119 from damaging heat arises mainly from the openness of the top cover 130, and air flow slot 150 on the bottom portion of the housing 104. Air flow slot 150 and the open nature of the top cover 130 allow forced convection air to travel through the chassis 100 and over the circuit cards 118. This cooling air flow may be generated by cooling fans, and the heat removed by the flowing air may be cooled via a heat exchanger. Moreover, the air flow slot 150 on the underside of the housing 104, in conjunction with the openness of the top cover 130, allows for the stacking of two or more chassis 100 without the heat removal capability of the chassis 100 being adversely affected. This is due primarily to the alignment of the air flow slots 150 and the opening of the top cover 130.

That the design of the chassis 100 protects the circuit card stack 119 from excessive vibrations, shock and temperature was confirmed in several tests performed on prototypes of the chassis 100. Shock loads of 160g vertical and 100 g lateral were applied to a chassis 100 (in a full sine wave pulse IAW Mil-S-901D). To test its vibration resistance, vibration loads of random 11 g-rms for 90 seconds were applied to a chassis 100. Neither the circuit card 118 nor circuit card stack 119 suffered any debilitating damage as a result of these tests, as indicated by their continued operability. The design of the chassis 100, including top cover 130, air flow slots 150, and dead space between circuit cards 118, enables the chassis 100 to maintain the temperature surrounding the circuit cards 118. In one test, the temperature within the circuit card stack 119 did not exceed 70° C. in a 50° C. operating enviroment. This temperature was found to be not harmful to the circuit cards 118.

The connector end 106 is equipped with blind-mate self-aligning connectors permitting the coupling of I/O connectors 124 to a receiving unit without the need for visibly guiding I/O connectors 124 into the receiving unit. Specifically, one or more circuit cards 118 may be placed into the chassis 100, snapped into place which electronically couples them to the chassis 100, and then connected to the I/O connectors 124 at the connector end 106 via wiring running through cable routing space 152. If the space into which the chassis 100 is inserted is not accessible, connector alignment unit 126 and connector alignment pin 120 may be positioned such that an opening on the receiving unit will receive connector pin 120, and consequently match up I/O connectors 124 into the receiving unit's slots or sockets. Additionally, shear/alignment pins 129 assist in the blind-mating feature of the chassis 100 by mating into receiving holes in a receiving unit. Moreover, because of their penetration into a receiving unit, the shear pins 129 hold the chassis 100 in place when the chassis 100 is exposed to shearing forces.

Since the number of I/O connectors 124 is not insignificant (212 and 316 pins in two separate embodiments), and it takes approximately one pound of pressure per pin to insert the I/O connector pins 124 into each respective receiving socket, a total pressure of about 200–300 pounds of force is required to install a chassis 100. Consequently, jacking type screw 116, which is positioned on front face 102, is tightened into a threaded opening on a receiving unit, which pulls the chassis 100 into position with the necessary force to cause the proper connection of all I/O connector pins 124. The moment pins 115 located just behind the front face 102 negate the torque resulting from the tightening of the jacking screw 116. That is, without moment pins 115, the chassis 100 would have a tendency to pull up instead of sliding straight into a receiving unit.

What is claimed is:

1. A chassis for circuit cards comprising:
   a housing;
   a top cover attached to said housing;
   a front face attached to a front end of said housing;
   a connector end attached to a back end of said housing;
   a stainless steel stabilizer rod connected at a first end to said front face and connected at a second end to said connector end;
   one or more stainless steel spacers positioned on said stabilizer rod; and
   one or more stainless steel stabilizer brackets positioned on said stabilizer rod;
   wherein said front face comprises:
      a jacking type screw; and
      one or more moment pins;
   wherein said connector end comprises:
      a connector alignment pin;
      a shear alignment pin;
      I/O connectors; and
      a pin guard;
   wherein said top cover comprises:
      two longitudinal braces; and
      one or more transverse guards;
   and wherein said housing comprises an air flow slot on an underside of said housing.

2. The chassis for circuit cards according to claim 1, wherein said circuit cards are manufactured according to a PC 104 standard.

3. The chassis for circuit cards according to claim 1, further comprising rubber padding positioned below said top cover and between said circuit cards and said housing.

4. The chassis for circuit cards according to claim 1, further comprising a cable routing space positioned between said circuit cards and said housing.

5. The chassis for circuit cards according to claim 1, wherein said stabilizer rod penetrates said circuit cards, thereby forming a circuit card stack.

6. The chassis for circuit cards according to claim 1, wherein said chassis is inserted into an aircraft system.

7. The chassis for circuit cards according to claim 1, wherein said chassis is inserted into a rocket launching system.

8. The chassis for circuit cards according to claim 1, wherein forced convection air circulates between said top cover and said airflow slot.

9. The chassis for circuit cards according to claim 1, wherein said chassis and circuit cards are able to withstand a vibration load of random 11 g-rms for about 90 seconds.

10. The chassis for circuit cards according to claim 1, wherein said chassis and circuit cards are able to withstand shock loads of 160 g vertical and 100 g lateral.

11. The chassis for circuit cards according to claim 1, wherein the temperature within said circuit card stack does not exceed 70° C. in a 50° C. operating environment.

12. The chassis for circuit cards according to claim 1, wherein forced convection air is circulated through said chassis and between said circuit cards, and further wherein said air is removed from said chassis and cooled in a heat exchanger.

13. The chassis for circuit cards according to claim 1, wherein said connector alignment pins and said shear alignment pins allow blind mating between said I/O connectors and a receiving unit.

14. The chassis for circuit cards according to claim 1, wherein said jacking type screw allows sufficient pressure to be applied to said chassis for said I/O connectors of said chassis to mate with a receiving unit, and further wherein said moment pins prevent said chassis from deviating from a proper line of installation.

15. A chassis for circuit cards comprising:
   a housing;
   a top cover attached to said housing;
   a front face attached to a front end of said housing;
   a connector end attached to a back end of said housing;
   means to physically connect each circuit card to another circuit card; and
   means to connect said circuit cards to said front face and said connector end;
   wherein said front face further comprises means to install said chassis such that at least 200 I/O connector pins may be forced into a receiving unit;
   wherein said connector end further comprises means to align said chassis in a blind mating installation;
   and further wherein said top cover and said housing comprise means to permit the flow of forced air convection to maintain the temperature surrounding said circuit cards.

16. The chassis for circuit cards according to claim 15, wherein said circuit cards are manufactured according to a PC 104 standard.

17. The chassis for circuit cards according to claim 15, further comprising means to cushion said circuit cards from vibration and shock trauma.

18. A process to protect circuit cards from shock, vibration and temperature trauma using a circuit card as described in claim 1, comprising the steps of:
   inserting said circuit cards into said chassis;

placing said chassis into a receiving unit;

aligning said chassis with said unit with the aid of one or more alignment pins disposed on said chassis; and forcing said chassis into said receiving unit via a jacking type screw.

19. The process to protect circuit cards according to claim 18, wherein said circuit cards are manufactured according to a PC 104 standard.

* * * * *